US011469287B2

(12) United States Patent
Lee et al.

(10) Patent No.: US 11,469,287 B2
(45) Date of Patent: Oct. 11, 2022

(54) DISPLAY PANEL AND METHOD FOR MANUFACTURING THE SAME

(71) Applicant: Samsung Display Co., Ltd., Yongin-Si (KR)

(72) Inventors: Chang-Hun Lee, Hwaseong-si (KR); Min-Jae Kim, Suwon-si (KR); Min-Hee Kim, Ansan-si (KR); Taehoon Kim, Suwon-si (KR); Kyunghae Park, Seongnam-si (KR); Joon-Hyung Park, Seoul (KR); Danbi Yang, Gunpo-si (KR); Hanjun Yu, Seoul (KR); DoKyung Youn, Cheonan-si (KR)

(73) Assignee: Samsung Display Co., Ltd.

( * ) Notice: Subject to any disclaimer, the term of this patent is extended or adjusted under 35 U.S.C. 154(b) by 267 days.

(21) Appl. No.: 16/846,246

(22) Filed: Apr. 10, 2020

(65) Prior Publication Data

US 2020/0388663 A1    Dec. 10, 2020

(30) Foreign Application Priority Data

Jun. 7, 2019    (KR) .................... 10-2019-0067404

(51) Int. Cl.
*H01L 27/32* (2006.01)
*H01L 51/52* (2006.01)
*H01L 51/56* (2006.01)

(52) U.S. Cl.
CPC ........ *H01L 27/3272* (2013.01); *H01L 27/322* (2013.01); *H01L 27/3246* (2013.01);
(Continued)

(58) Field of Classification Search
CPC .............. H01L 27/3272; H01L 27/322; H01L 27/3246; H01L 27/3211; H01L 27/3248;
(Continued)

(56) References Cited

U.S. PATENT DOCUMENTS 7,417,373 B2    8/2008    Yamazaki
10,185,066 B2    1/2019    Chae et al.
(Continued)

FOREIGN PATENT DOCUMENTS

KR    10-2017-0015700 A    2/2017
KR    10-2018-0018945 A    2/2018

*Primary Examiner* — Matthew E. Gordon
*Assistant Examiner* — Gardner W. S. Swan
(74) *Attorney, Agent, or Firm* — Innovation Counsel LLP

(57) ABSTRACT

The display panel includes an upper display substrate including a plurality of pixel areas and a light blocking area, a lower display substrate. The upper display substrate includes a base substrate, a barrier part overlapping the light blocking area and disposed on the base substrate, a light blocking layer including a first light blocking portion disposed on the barrier part and a second light blocking portion disposed on the same layer as the barrier part to respectively overlap the pixel areas, a reflection layer including a first reflection portion disposed on the first light blocking portion and a second reflection portion disposed on the second light blocking portion, and a light control layer overlapping the pixel areas and disposed on the reflection layer. A plurality of openings passing through the second light blocking portion and the second reflection portion are defined in each of the pixel areas.

15 Claims, 13 Drawing Sheets

(52) U.S. Cl.
CPC ...... *H01L 51/5271* (2013.01); *H01L 51/5284* (2013.01); *H01L 51/56* (2013.01); *H01L 2227/323* (2013.01)

(58) Field of Classification Search
CPC ............. H01L 27/3262; H01L 51/5271; H01L 51/5284; H01L 51/56; H01L 51/5262; H01L 2227/323
USPC .......................................................... 257/40
See application file for complete search history.

(56) References Cited

U.S. PATENT DOCUMENTS

2018/0331326 A1* 11/2018 Woo ..................... H01L 27/3272
2020/0152704 A1* 5/2020 Jang ........................ H01L 51/56
2020/0194729 A1* 6/2020 Park ................... H01L 51/5284

* cited by examiner

DISPLAY PANEL AND METHOD FOR MANUFACTURING THE SAME

CROSS-REFERENCE TO RELATED APPLICATIONS

This U.S. non-provisional patent application claims priority under 35 U.S.C. § 119 of Korean Patent Application No. 10-2019-0067404, filed on Jun. 7, 2019, the entire contents of which are hereby incorporated by reference.

BACKGROUND

The present disclosure relates to a display panel, and more particularly, to a display panel and a method for manufacturing the same.

Various display devices used in multimedia equipment such as televisions, mobile phones, table computers, navigation devices, and game consoles are being developed. A display device includes a transmissive display panel which is selectively transmitting source light generated from a light source and an emission type display panel which is generating source light in the display panel itself.

However, when the display device is used in an outdoor space, reflection and scattering may occur on a display surface, on which an image is visible, by external light. Therefore, a novel way to reduce external light reflection and to improve display quality is, therefore, needed.

SUMMARY

The present disclosure provides a display panel that is capable of reducing external light reflection and a method for manufacturing the same.

An embodiment of the present disclosure provides a display panel including an upper display substrate on which a plurality of pixel areas and a light blocking area adjacent to the pixel areas are defined, and a lower display substrate facing the upper display substrate and including a plurality of display elements respectively overlapping the pixel areas, wherein the upper display substrate includes a base substrate defining the pixel areas and the light blocking area, a barrier part overlapping the light blocking area and disposed on the base substrate, a light blocking layer including a first light blocking portion disposed on the barrier part and a second light blocking portion disposed on the same layer as the barrier part to respectively overlap the pixel areas, a reflection layer including a first reflection portion disposed on the first light blocking portion and a second reflection portion disposed on the second light blocking portion, and a light control layer overlapping the pixel areas and disposed on the reflection layer, wherein a plurality of openings passing through the second light blocking portion and the second reflection portion are defined in each of the pixel areas, and the openings overlap the pixel areas, respectively.

In an embodiment, each of the openings may be surrounded by the second light blocking portion in a top plan view.

In an embodiment, the second light blocking portion overlapping a first pixel area of the pixel areas may include a first light blocking area and a second light blocking area, which are spaced apart from each other in a first direction with respect to a first opening, which overlaps the first pixel area, of the openings, and a width of the first light blocking area, a width of the first opening, and a width of the second light blocking area in the first direction may be substantially equal.

In an embodiment, the second light blocking portion may further include a third light blocking area and a fourth light blocking area, which are spaced apart from each other in a second direction perpendicular to the first direction with the first opening, and a width of the third light blocking area, the width of the first opening, and a width of the fourth light blocking area in the second direction may be substantially equal.

In an embodiment, the second light blocking portion overlapping a first pixel area of the pixel areas may have a surface area greater than a surface area of the opening, which overlaps the first pixel area, in the top plan view.

In an embodiment, the first light blocking portion may be disposed between the barrier part and the first reflection portion, and the second light blocking portion may be disposed between the base substrate and the second reflection portion.

In an embodiment, the barrier part may include a top surface facing the base substrate, a bottom surface facing the lower display substrate, and a side surface connecting the top surface to the bottom surface, and the first light blocking portion may expose at least a portion of the bottom surface of the barrier part.

In an embodiment, a bottom surface opening passing through the first light blocking portion and the first reflection portion and exposing the bottom surface of the barrier part may be defined.

In an embodiment, the reflection layer may entirely overlap the light blocking layer.

In an embodiment, the display panel may further include: a color filter layer disposed between the base substrate and the light control layer; and an upper insulation layer covering the color filter layer and disposed on the base substrate, wherein each of the openings may expose the upper insulation layer.

In an embodiment, the display elements may emit first color light to the upper display substrate, the pixel areas may include first, second, and third pixel areas that are arranged in one direction, and the light control layer may include: a first conversion part overlapping the first pixel area and configured to convert the first color light so as to emit second color light; a second conversion part overlapping the second pixel area and configured to convert the first color light so as to emit third color light different from the second color light; and a transmission part overlapping the third pixel area and configured to transmit the first color light.

In an embodiment, the color filter layer may include: a first color filter overlapping the first pixel area and configured to transmit the second color light different from the first color light; a second color filter overlapping the second pixel area and configured to transmit the third color light different from the second color light; and a third color filter overlapping the third pixel area and configured to transmit the first color light, wherein the third color filter may include a filter portion overlapping the third pixel area and a light blocking portion overlapping the light blocking area.

In an embodiment, the lower display substrate may further include a pixel defining layer in which light emitting openings respectively overlapping the pixel areas are defined, each of the display elements may include a first electrode, a light emitting layer disposed on the first electrode, and a second electrode disposed on the light emitting layer, the first electrode is exposed by a corresponding light emitting opening of the light emitting openings, and a height of the barrier part is greater than the shortest distance from a bottom surface of the barrier part to an extension surface parallel to a top surface of the first electrode in a thickness direction perpendicular to the base substrate.

In an embodiment, a ratio of the height of the barrier part to the shortest distance may be 2:1 in the thickness direction.

In an embodiment, the first light blocking portion and the second light blocking portion may be provided in an integrated shape, and the first reflection portion and the second reflection portion may be provided in an integrated shape.

In an embodiment of the inventive concept, a display panel includes: an upper display substrate on which a plurality of pixel areas and a light blocking area adjacent to the pixel areas are defined; and a lower display substrate facing the upper display substrate and comprising a plurality of display elements respectively overlapping the pixel areas, wherein the upper display substrate includes: a base substrate defining the pixel areas and the light blocking area; an insulation layer disposed on the base substrate; a first light blocking layer which is directly disposed on the insulation layer and in which openings respectively overlapping the pixel areas are defined; a first reflection layer disposed on the first light blocking layer; a light control layer overlapping the pixel areas and disposed on the first reflection layer; a barrier part overlapping the light blacking area and disposed on the light control layer; a second light blocking layer disposed on the barrier part; and a second reflection layer disposed on the second light blocking layer.

In an embodiment, the first light blocking layer and the second light blocking layer may be spaced apart from each other with respect to the light control layer, and the first reflection layer and the second reflection layer may be spaced apart from each other with respect to the light control layer.

In an embodiment, the first light blocking layer and the second light blocking layer may be spaced apart from each other with respect to the light control layer in a thickness direction perpendicular to the base substrate.

In an embodiment of the inventive concept, a method for manufacturing a display panel includes: forming a barrier part overlapping a light blocking area on an upper base substrate on which first to third pixel areas and the light blocking area adjacent to the first to third pixel areas are defined; entirely forming a light blocking layer covering the barrier part on the upper base substrate; entirely forming a reflection layer on the light blocking layer; forming first to third openings passing through the light blocking layer and the reflection layer to respectively overlap the first to third pixel areas; forming a light control layer, which comprises a first conversion part overlapping the first pixel area, a second conversion part overlapping the second pixel area, and a transmission part overlapping the third pixel area, on the reflection layer; and coupling the upper base substrate to the lower base substrate on which display elements are disposed.

In an embodiment, the light blocking layer overlapping the first pixel area of the pixel areas may have a surface area greater than a surface area of the opening, which overlaps the first pixel area.

BRIEF DESCRIPTION OF THE DRAWINGS

The accompanying drawings are included to provide a further understanding of the concept, and are incorporated in and constitute a part of this specification. The drawings illustrate example embodiments of the inventive concept and, together with the description, serve to explain principles of the inventive concept. In the drawings.

DETAILED DESCRIPTION

Figure 1:
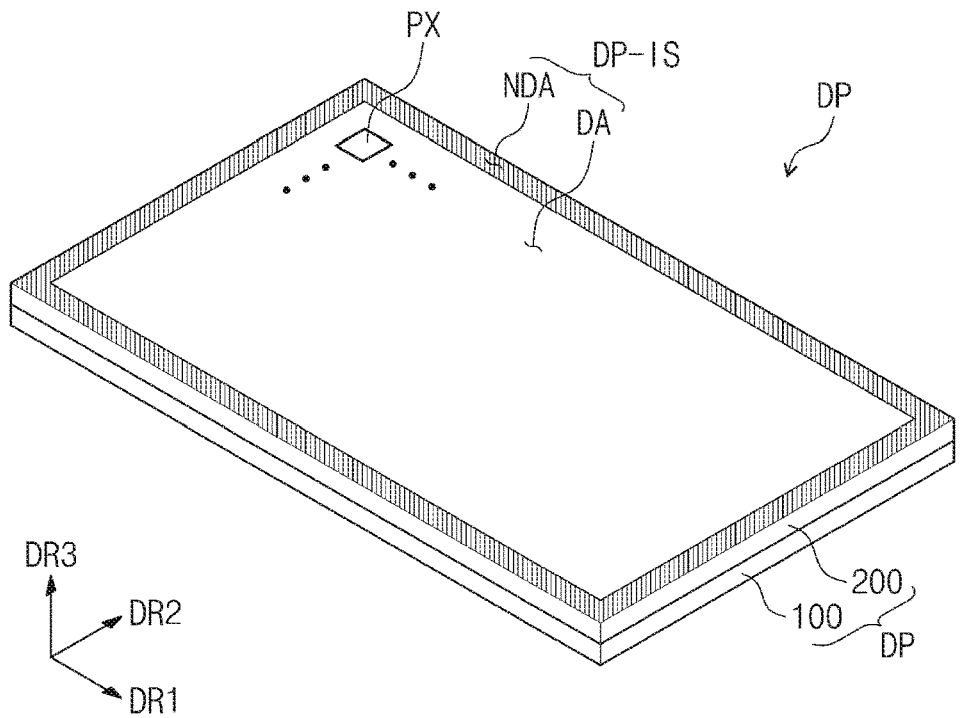
FIG. 1 is a perspective view of a display panel according to an embodiment of the present disclosure.

It will be understood that when one component (or region, layer, portion) is referred to as being "on", "connected to", or "coupled to" another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, example embodiments of the present disclosure will be described with reference to the accompanying drawings.

Figure 2:
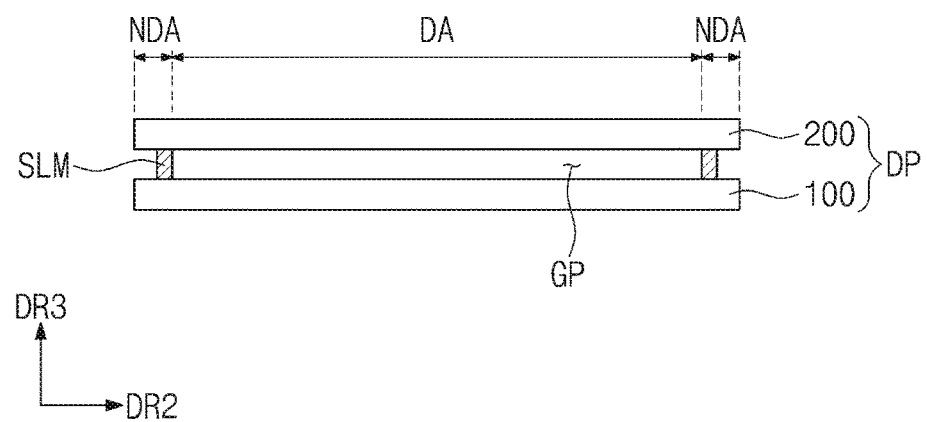
FIG. 2 is a cross-sectional view of the display panel according to an embodiment of the present disclosure.

FIG. 1 is a perspective view of a display panel according to an embodiment of the present disclosure. FIG. 2 is a cross-sectional view of the display panel according to an embodiment of the present disclosure;

Referring to FIG. 1, the display panel DP may include a lower display substrate 100 and an upper display substrate 200 facing the lower display substrate 100 and spaced apart from the lower display substrate 100. As illustrated in FIG. 1, the display panel DP may display an image through a display surface DP-IS. The display surface DP-IS is parallel to a surface defined by a first direction DR1 and a second direction DR2.

The display surface DP-IS may include a display area DA and a non-display area NDA. A plurality of pixels PX is disposed on the display area DA and is not disposed on the non-display area NDA. The non-display area NDA may be defined along an edge of the display surface DP-IS. According to an embodiment, the display area DA may be surrounded by the non-display area NDA. However, the embodiment of the present disclosure is not limited. The non-display area NDA may be adjacent to one side of the display area DA or be omitted.

A normal direction of the display surface DP-IS, i.e., a thickness direction of the display panel DP is indicated as a third direction DR3. In this specification, "when viewed in a top plan view or in the top plan view" may mean a case when viewed in the third direction DR3. A front surface (or a top surface) and a rear surface (or a bottom surface) of each of layers or units, which will be described below, are distinguished by the third direction DR3. However, directions indicated as the first, second, and third directions DR1, DR2, and DR3 may be changed into different directions, for example, opposite directions as a relative concept.

According to an embodiment of the present disclosure, although the display panel DP having a planar display surface DP-IS is illustrated, the embodiment of the present disclosure is not limited. For example, the display panel DP may include a display surface of which at least a portion has a curved shape or a display surface having a solid shape in the top plan view. The solid display surface may include a plurality of display areas that indicate different directions.

Referring to FIG. 2, an inner space GP may be defined between the upper display substrate 200 and the lower display substrate 100. The inner space GP may be maintained by an adhesion layer SLM disposed between the upper display substrate 200 and the lower display substrate 100. For example, the adhesion layer SLM may include an organic adhesion member or an inorganic adhesion member.

Figure 3:
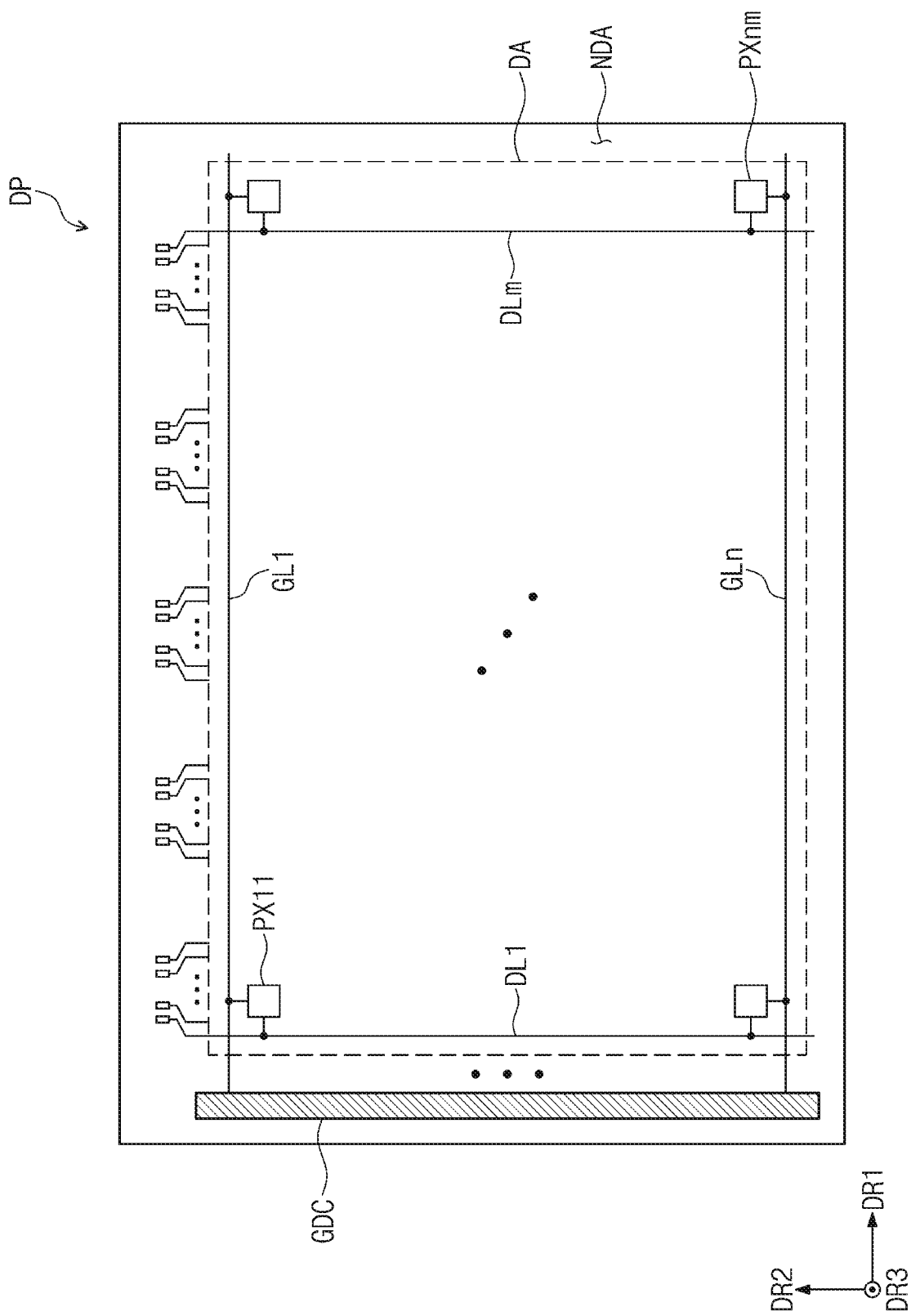
FIG. 3 is a top plan view of the display panel according to an embodiment of the present disclosure.

FIG. 3 is a top plan view of the display panel according to an embodiment of the present disclosure.

Referring to FIG. 3, the display panel DP includes a gate driver circuit GDC, pixels PX11 to PXnm, and a plurality of signal lines GL1 to GLn and DL1 to DLm. FIG. 3 illustrates an arrangement relationship between the signal lines GL1 to GLn and DL1 to DLm and the pixels PX11 to PXnm in a top plan view.

In the top plan view, the plurality of pixels PX11 to PXnm overlap the display area DA, and the plurality of signal lines GL1 to GLn and DL1 to DLm and the gate driver circuit GDC overlap the non-display area NDA. The plurality of signal lines GL1 to GLn and DL1 to DLm may include a plurality of gate lines GL1 to GLn, and a plurality of data lines DL1 to DLm.

Each of the pixels PX11 to PXnm are connected to the corresponding gate lines of the plurality of gate lines GL1 to GLn and the corresponding data lines of the plurality of data lines DL1 to DLm, respectively. Each of the pixels PX11 to PXnm may include a pixel driving circuit and a display element. Other signal lines may be provided on the display panel DP according to a configuration of the pixel driving circuit.

The pixels PX11 to PXnm may be disposed in a matrix form, but is not limited. For example, the pixels PX11 to PXnm may be disposed in the form of a pentile or in the form of a diamond.

A gate driver circuit GDC may be disposed on the non-display area NDA. The gate driving circuit GDC may be integrated with the display panel DP through an oxide silicon gate driving circuit (OSG) process or an amorphous silicon gate driving circuit (ASG) process.

Figure 4A:
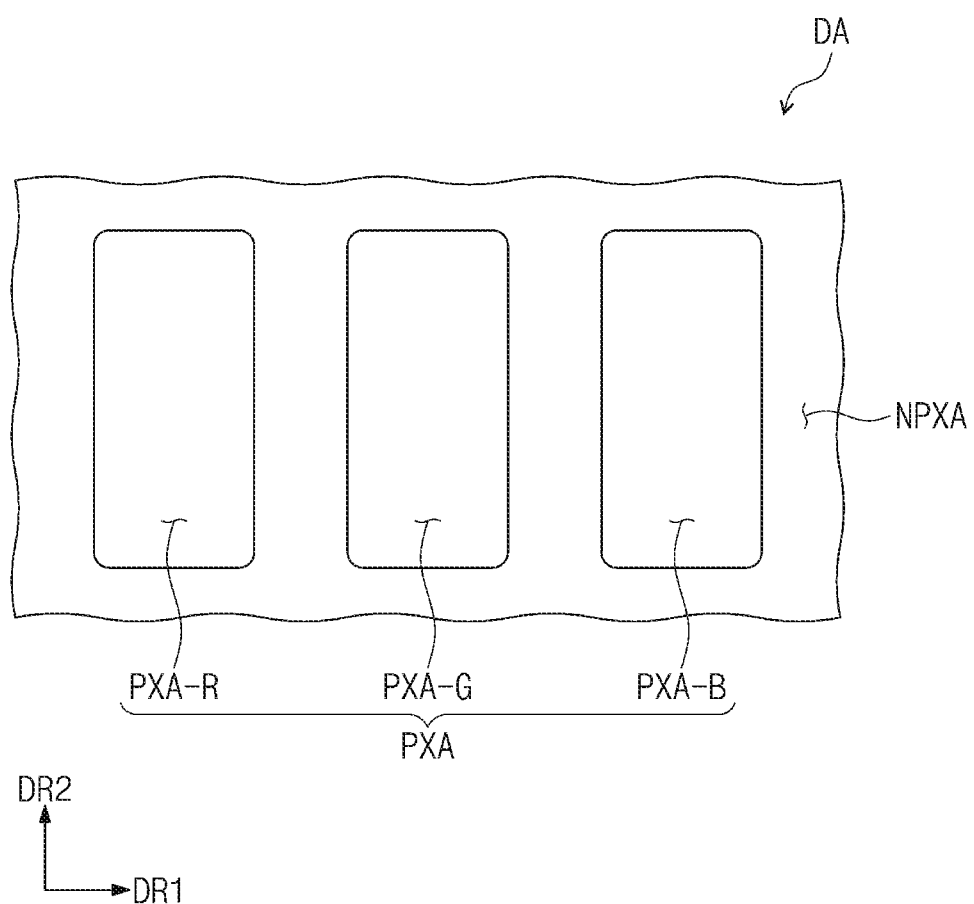
FIG. 4A is a top plan view illustrating pixel areas of the display area of the display panel according to an embodiment of the present disclosure.
Figure 4B:
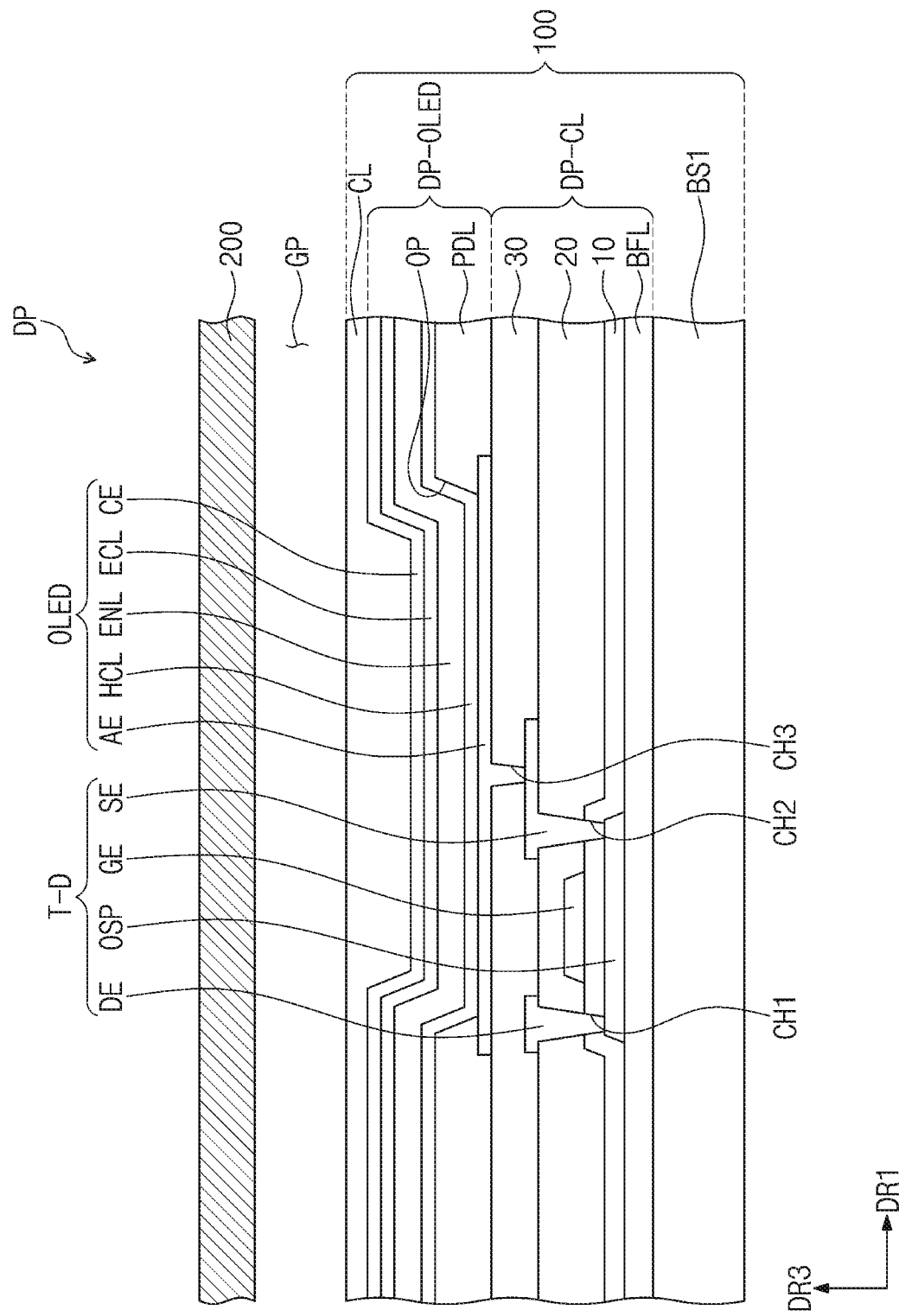
FIG. 4B is a cross-sectional view of the display panel that shows a portion of the pixel area according to an embodiment of the present disclosure.

FIG. 4A is a top plan view illustrating pixel areas of the display area of the display panel according to an embodiment of the present disclosure. FIG. 4B is a cross-sectional view of the display panel that shows a portion of the pixel area according to an embodiment of the present disclosure.

FIG. 4A is an enlarged view illustrating a portion of the display area DA of FIG. 1. The display area DA may include a pixel area PXA and a light blocking area NPXA adjacent to the pixel area PXA. In the top plan view, the light blocking area NPXA may surround the pixel area PXA. For example, FIG. 4A illustrates a structure in which the pixel area PXA includes three kinds of pixel areas PXA-R, PXA-G, and PXA-B spaced apart from each other along the first direction DR1. The three kinds of pixel areas PXA-R, PXA-G, and PXA-B of FIG. 4A may be repeatedly disposed on the entire display area DA in the first and second directions.

A light blocking area NPXA is disposed around the first second, and third pixel areas PXA-R, PXA-G, and PXA-B. The first, second, and third pixel areas PXA-R, PXA-G, and PXA-B and the light blocking area NPXA may be substantially defined on the upper display substrate 200.

The pixel area PXA means an area through which light is actually emitted to the outside through the display surface DD-IS that is described with reference to FIG. 1. The pixel areas PXA may emit the received light to the outside, and the light blocking area NPXA may absorb or reflect the received light.

Although the first, second, and third pixel areas PXA-R, PXA-G, and PXA-B having the same surface areas in the top plan view are exemplified in FIG. 4A, the embodiment of the present disclosure is not limited. For example, the first, second, and third pixel areas PXA-R, PXA-G, and PXA-B may have surface areas different from each other or have at least two or more areas different from each other.

Also, although each of the first, second, and third pixel areas PXA-R, PXA-G, and PXA-B has a rectangular shape with a rounded corner area in the top plan view, the embodiment of the present disclosure is not limited. The first, second, and third pixel areas PXA-R, PXA-G, and PXA-B may have different polygonal shapes in the top plan view. Alternatively, each of first, second, and third pixel areas PXA-R, PXA-G, and PXA-B may have square shape having rounded corner area.

One of the first, second, and third pixel areas PXA-R, PXA-G, and PXA-B may provide first color light having a wavelength band of a first color to the user, the other one of the first, second, and third pixel areas PXA-R, PXA-G, and PXA-B may provide second color light having a wavelength band of a second color different from the first color to the user, and the remaining pixel may provide third color light having a wavelength band of a third color different from the first color and the second color to the user.

For example, the first pixel area PXA-R may emit red light, the second pixel area PXA-G may emit green light, and the third pixel area PXA-B may emit blue light. According to an embodiment of the present disclosure, source light may be blue light that is the first color light. The source light may be generated in a light source such as a backlight unit or generated in a display element such as a light emitting diode (LED).

The light blocking area NPXA may set a boundary between the first, second, and third pixel areas PXA-R, PXA-G, and PXA-B to prevent the colors from being mixed with each other between the first, second, and third pixel areas PXA-R, PXA-G, and PXA-B. Also, the light blocking area NPXA may block the source light so that the source light does not reach to the user.

Particularly, the display panel DP according to an embodiment of the present disclosure may include a barrier overlapping the light blocking area NPXA. The barrier may prevent light outputted from two pixel areas adjacent to each other and improve light emission efficiency of light emitted from each of the pixel areas. This will be described in more detail with reference to FIG. 5.

FIG. 4B is a cross-sectional view illustrating an example of a driving transistor T-D corresponding to any one pixel area of the first, second, and third pixel areas PXA-R, PXA-G, and PXA-B and the display panel corresponding to the light emitting element OLED. However, the structure corresponding to the pixel area is not limited. For example, the pixel may further include a switching transistor connected to the driving transistor T-D. The switching transistor may be connected to the signal lines GL1 to GLn and DL1 to DLm. In FIG. 4B, the upper display substrate 200 is schematically illustrated.

Referring to FIG. 4B, the lower display substrate 100 includes a first base substrate BS1, a circuit element layer DP-CL disposed on the first base substrate BS1, a display element layer DP-OLED disposed on the circuit element layer DP-CL, and a cover layer CL In this disclosure, although the pixel element layer DP-CL is disclosed as an example, a structure of the pixel element layer DP-CL is not limited. For example, the structure of the pixel element layer DP-CL may be modified according to other embodiments.

The first base substrate BS1 may include a synthetic resin substrate or a glass substrate. The circuit element layer DP-CL includes at least one insulation layer and a circuit element. The circuit element includes the signal line and the driving circuit of the pixel. The circuit element layer DP-CL may be formed through a process of forming an insulation layer, a semiconductor layer, and a conductive layer by a coating or deposition process and a process of patterning the insulation layer, the semiconductor layer, and the conductive layer by a photolithography process.

In this embodiment, the circuit element layer DP-CL may include a buffer layer BFL, a first insulation layer 10, a second insulation layer 20, and a third insulation layer 30. For example, each of the first insulation layer 10 and the second insulation layer 20 may be an inorganic layer, and the third insulation layer 30 may be an organic layer. However, the embodiment of the present disclosure is not limited. For example, each of the first insulation layer 10 and the second insulation layer 20 may be a layer in which an inorganic layer and an organic layer are mixed.

FIG. 4B illustrates an example of an arrangement relationship of a semiconductor pattern OSP, a control electrode GE, an input electrode DE, an output electrode SE, which constitute the driving transistor T-D, and first, second, and third through-holes CH1, CH2, and CH3 are illustrated.

The display element layer DP-OLED includes the light emitting element OLED as a display element. The light emitting element OLED may generate the above-described source light. The light emitting element OLED includes the first electrode AE, the second electrode CE, and a light emitting layer ENL disposed between the first and second electrodes AE and CE. In this embodiment, the light emitting element OLED may include an organic light emitting diode. The display element layer DP-OLED includes a pixel defining layer PDL. For example, the pixel defining layer PDL may be an organic layer.

The first electrode AE is disposed on the third insulation layer 30. The first electrode AE is connected to the output electrode SE through the third through-hole CH3 passing through the third insulation layer 30. A light emitting opening OP is defined in the pixel defining layer PDL. According to an embodiment of the present disclosure, the light emitting opening OP may be defined as an emission area EA on which the first color light is emitted from the light emitting layer ENL.

The opening OP of the pixel defining layer PDL exposes at least some portions of the first electrode AE. That is, some portions of the first electrode AE overlaps the opening of the pixel defining layer PDL. According to an embodiment of the present disclosure, the light emitting opening OP may be defined as an emission area on which actual light is emitted from the light emitting element OLED. That is, the emission area may be provided in plurality, and the plurality of emission areas may respectively correspond to the pixel areas.

A hole control layer HCL, the light emitting layer ENL, and an electron control layer ECL may be commonly disposed on the first electrode AE and the pixel defining layer PDL. The hole control layer HCL, the light emitting layer ENL, and the electron control layer ECL may be commonly disposed on the first, second, and third pixel areas PXA-R, PXA-G, and PXA-B (see FIG. 4).

The hole control layer HCL may include a hole transport layer (not shown) and may further include a hole injection layer (not shown). The light emitting layer ENL may generate blue light. The blue light may include a wavelength of about 410 nm to about 480 nm. An emission spectrum of the blue light may have a maximum peak within a wavelength of about 440 nm to about 460 nm. The electron control layer ECL may include an electron transport layer (not shown) and may further include an electron injection layer (not shown). The light emitting layer ENL may have a tandem structure or a single layer structure.

A second electrode CE is disposed on the electronic control layer ECL. The second electrode CE may be commonly disposed on the first, second, and third pixel areas PXA-R, PXA-G, and PXA-B. The second electrode CE may have a surface area greater than that of the first electrode AE.

The cover layer CL may be disposed on the second electrode CE. The cover layer CL protects the second electrode CE. The cover layer CL may include an organic material or an inorganic material. In an embodiment, the cover layer CL may be omitted.

Although not separately shown, the lower display substrate 100 may include first, second, and third light emitting elements corresponding to the first, second, and third pixel areas PXA-R, PXA-G, and PXA-B of FIG. 4A. The first, second, and third light emitting elements may have the same laminated structure as each other and also may have the same laminated structure as the light emitting element OLED of FIG. 4B.

Figure 5:
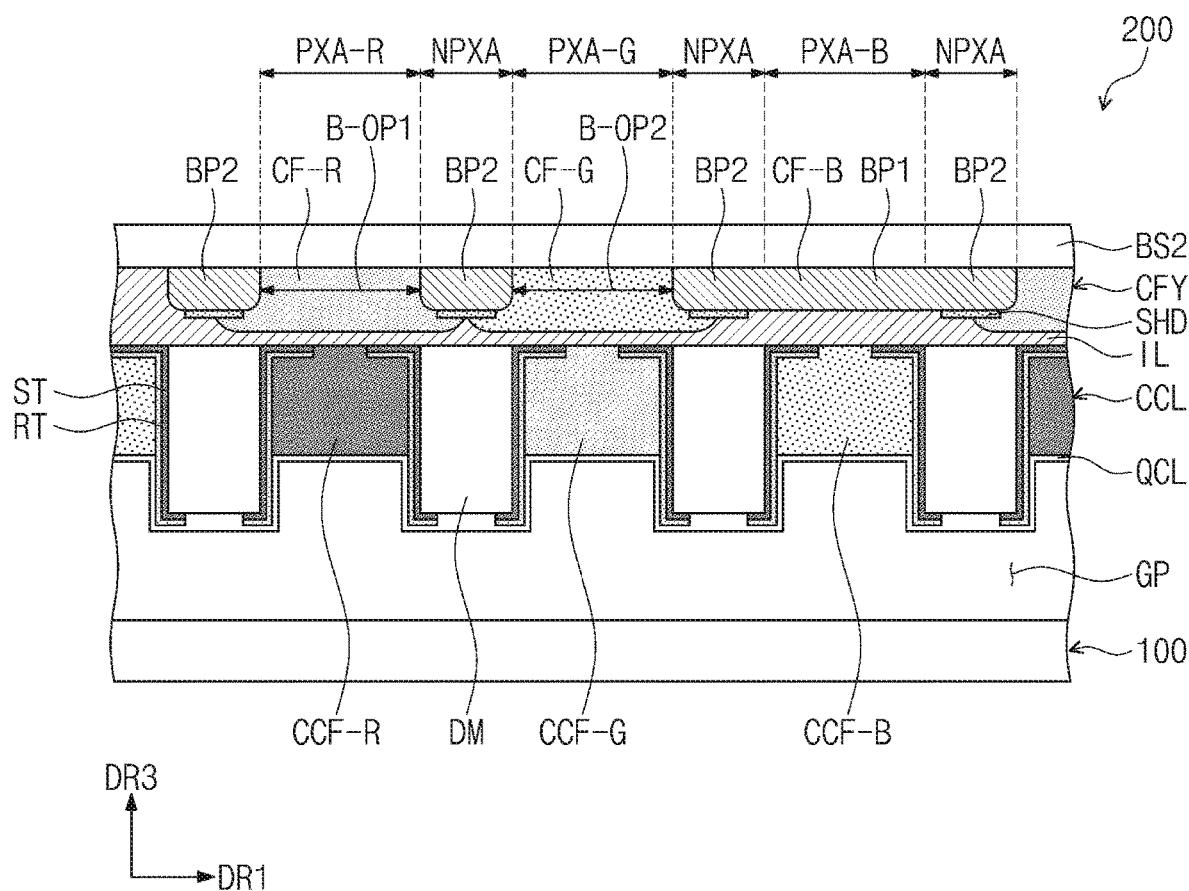
FIG. 5 is a cross-sectional view of the display panel according to an embodiment of the present disclosure.
Figure 6A:
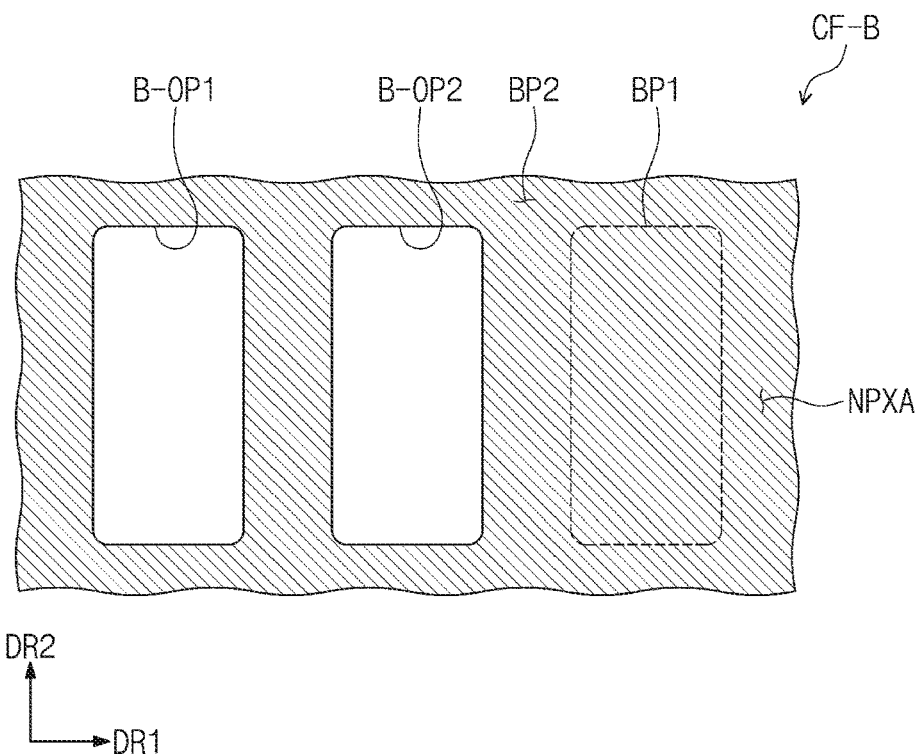
FIG. 6A is a top plan view illustrating laminated structures of the upper display substrate according to an embodiment of the present disclosure.
Figure 6B:
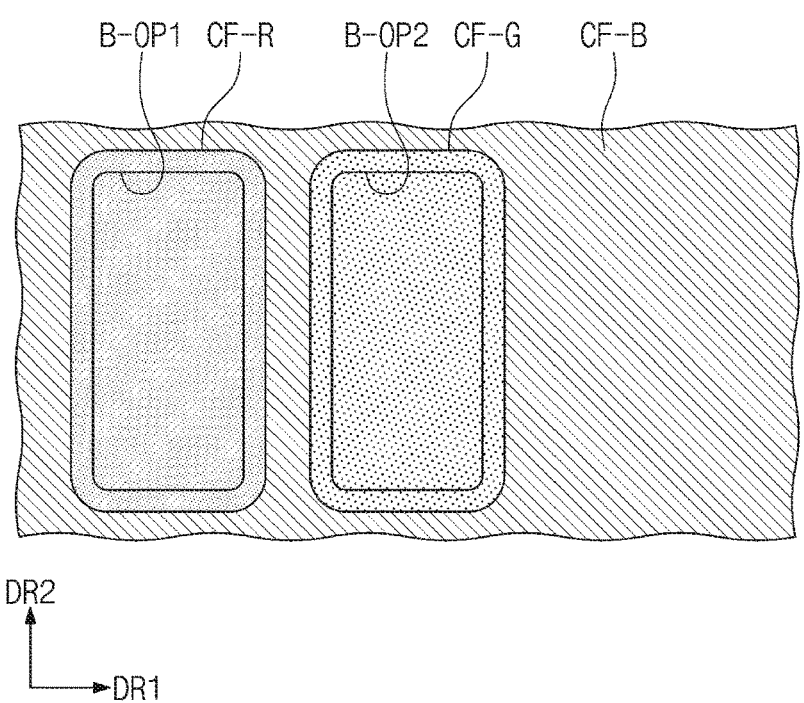
FIG. 6B is a top plan view illustrating laminated structures of the upper display substrate according to an embodiment of the present disclosure.
Figure 6C:
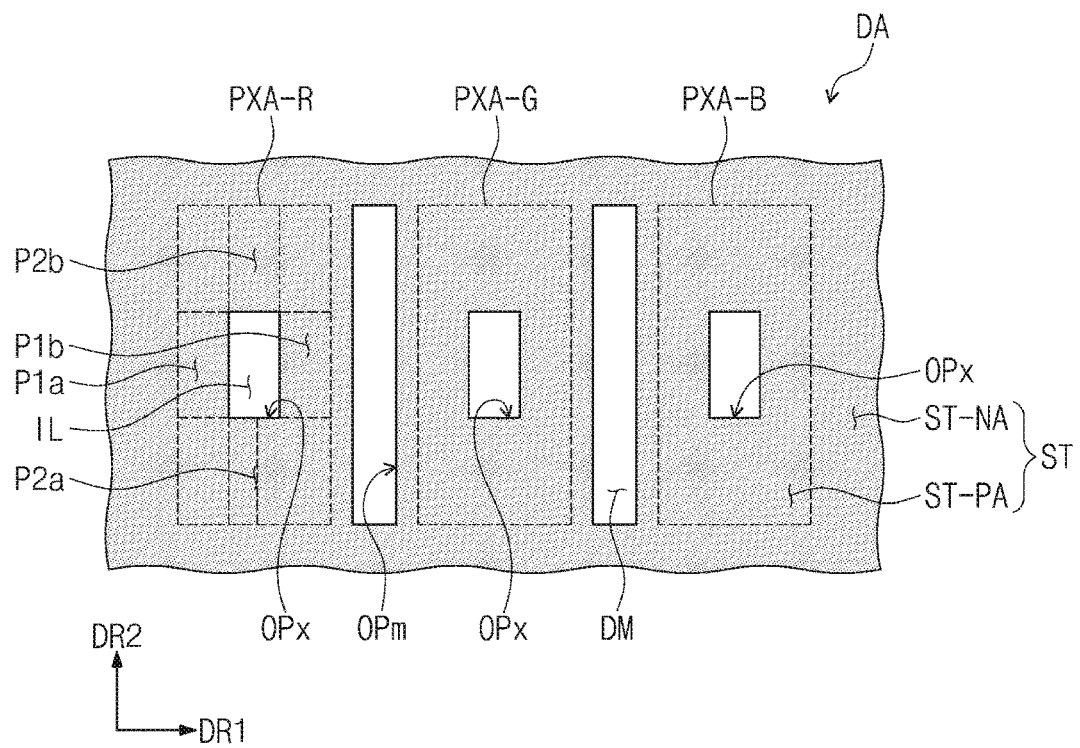
FIG. 6C is a top plan view illustrating laminated structures of the upper display substrate according to an embodiment of the present disclosure.
Figure 6D:
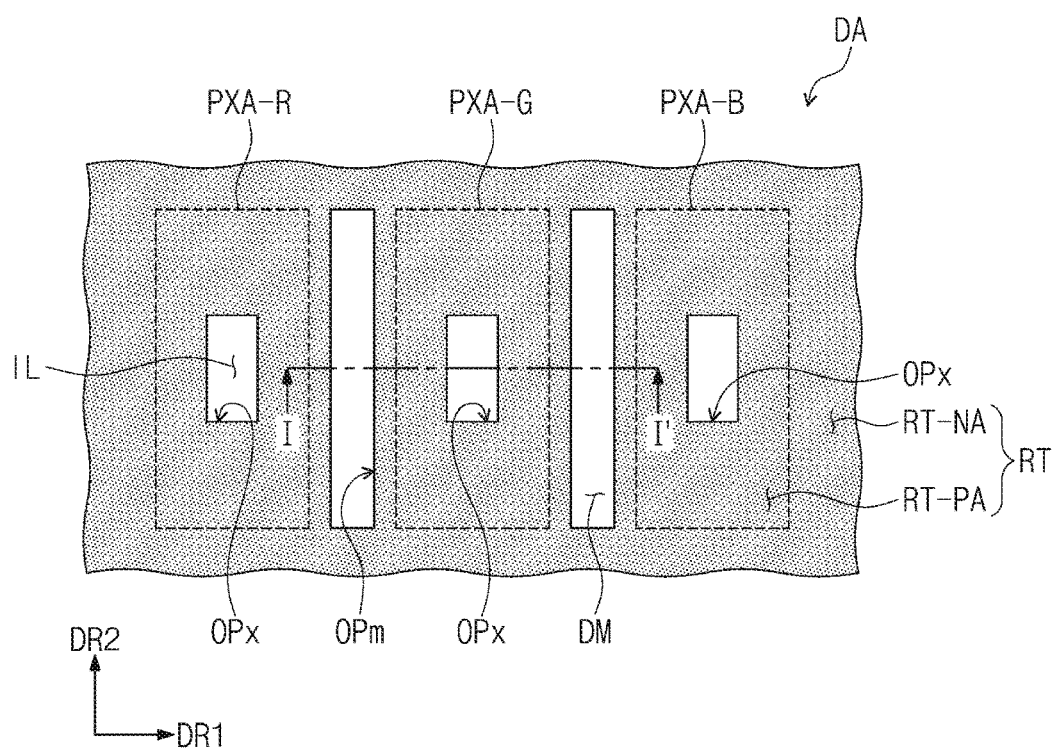
FIG. 6D is a top plan view illustrating laminated structures of the upper display substrate according to an embodiment of the present disclosure.
Figure 6E:
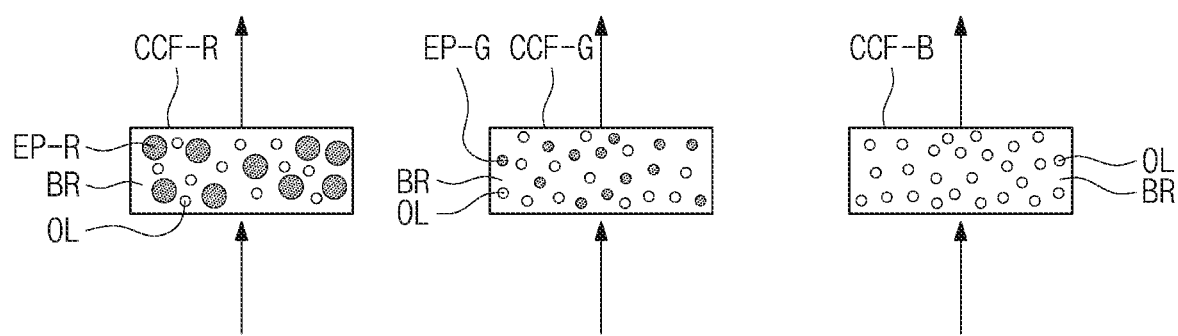
FIG. 6E is a schematic view illustrating light characteristics of a light control layer according to an embodiment of the present disclosure.

FIG. 5 is a cross-sectional view of the display panel according to an embodiment of the present disclosure. FIG. 6A is a plan view illustrating laminated structures of the upper display substrate according to an embodiment of the present disclosure. FIG. 6B is a top plan view illustrating laminated structures of the upper display substrate according to an embodiment of the present disclosure. FIG. 6C is a top plan view illustrating laminated structures of the upper display substrate according to an embodiment of the present disclosure. FIG. 6D is a top plan view illustrating laminated structures of the upper display substrate according to an embodiment of the present disclosure. FIG. 6E is a schematic view illustrating light characteristics of a light control layer according to an embodiment of the present disclosure.

Referring to FIG. 5, an upper display substrate 200 includes a second base substrate BS2, a color filter layer CFY, an upper insulation layer IL, a barrier part DM, a light control layer CCL, a light blocking layer ST, a reflection layer RT, a capping layer QCL, and an auxiliary light blocking layer SHD.

First, the second base substrate BS2 may include a synthetic resin substrate or a glass substrate. Particularly, pixel areas PXA-R, PXA-G, and PXA-B of FIG. 4A, from which actual light is emitted to the outside, and a light blocking area NPXA may be defined on the second base substrate BS2.

The color filter layer CFY may be disposed on the second base substrate BS2. The color filter layer CFY may include first, second, and third color filters CF-R, CF-G, and CF-B. According to an embodiment, the first to third color filters CF-R, CF-G, and CF-B may be directly disposed on the second base substrate BS2.

In this disclosure, "a constituent A is directly disposed on a constituent B" may mean that an adhesion member is not disposed between the constituents A and B. That is, the first, second, and third color filters CF-R, CF-G, and CF-B may be directly disposed on the second base substrate BS2 without using an adhesion layer.

The first color filter CF-R may overlap the first pixel area PXA-R to transmit light having a wavelength band of a red color and absorb light having other wavelength bands. The second color filter CF-G may overlap the second pixel area PXA-G to transmit light having a wavelength band of a green color and absorb light having other wavelength bands. The third color filter CF-B may overlap the third pixel area PXA-B to transmit light corresponding to the wavelength band of the blue color and absorb light having other wavelength bands.

According to an embodiment of the present disclosure, the third color filter CF-B may have a refractive index similar to that of the second base substrate BS2 rather than that of each of the first color filter CF-R and the second color filter CF-G. As a result, external light introduced from the outside may pass through the second base substrate BS2 and then be incident into the third color filter CF-B. Thus, external light reflection occurring on an interface between the second base substrate BS2 and the third color filter CF-B may be reduced. However, the embodiment of the present disclosure is not limited. For example, each of the first, second, and third color filters CF-R, CF-G, and CF-B may have a refractive index similar to that of the second base substrate BS2.

The third color filter CF-B may be divided into a filter portion BP1 serving as a color filter and a light blocking portion BP2 performing a light blocking function. The filter portion BP1 is disposed between the two light blocking portions BP2. The filter portion BP1 may overlap the third pixel area PXA-B, and the light blocking portion BP2 may overlap the light blocking area NPXA. The first, second, and third color filters CF-R, CF-G, and CF-B overlapping the display area DA may be partitioned by the auxiliary light blocking layer SHD or the light blocking portion BP2.

In more detail, referring to FIG. 6A, an organic layer having a blue color is formed on one surface of the second base substrate BS, and then, the organic layer may be exposed and developed to form the third color filter CF-B having a first opening B-OP1 and a second opening B-OP2. That is, the filter portion BP1 and the light blocking portion BP2 may be provided as a single body.

Referring to FIG. 6B, the first color filter CF-R is disposed in the first opening B-OP1 defined in the third color filter CF-B. In the top plan view, the first color filter CF-R may entirely cover the first opening B-OP1 and be disposed on at least a portion of the light blocking portion BP2. The second color filter CF-G is disposed in the second opening B-OP2 defined in the third color filter CF-B. In the top plan view, the second color filter CF-G may entirely cover the second opening B-OP2 and be disposed on at least a portion of the light blocking portion BP2.

Referring back to FIG. 5, the auxiliary light blocking layer SHD may be disposed on the light blocking portion BP2 of the third color filter CF-B. Each of a portion of the first color filter CF-R and a portion of the second color filter CF-G may cover a portion of the auxiliary light blocking layer SHD. An edge of the first color filter CF-R and the auxiliary light blocking layer SHD may absorb the external light transmitted through the light blocking portion BP2 to prevent the colors from being mixed with each other between the first, second, and third pixel areas PXA-R, PXA-G, and PXA-B. Also, the auxiliary light blocking layer SHD may absorb a portion of light outputted from the light control layer CCL.

The upper insulation layer IL may cover the first, second, and third color filters CF-R, CF-G, and CF-B and be disposed on the second base substrate BS2. For example, the upper insulation layer IL may be provided as an organic layer, an inorganic layer, or a mixture of organic and inorganic layer.

The barrier part DM may overlap the light blocking area NPXA and be disposed on the upper insulation layer IL. Particularly, according to an embodiment, since the barrier part DM is directly disposed on the upper insulation layer IL, the light control layer CCL may not be disposed between the barrier part DM and the second base substrate BS2. The barrier part DM may have a shape that extends in the third direction DR3 to partition constituents provided in the light control layer CCL.

The barrier part DM may include a top surface, a bottom surface facing the top surface, and a side surface connecting the top surface to the bottom surface. The top surface of the barrier part DM may be directly disposed on the upper insulation layer IL, and the bottom surface of the barrier part DM may face the lower display substrate 100.

The light blocking layer ST may cover at least a portion of the barrier part DM and be disposed on the upper insulation layer IL. The light blocking layer ST may at least partially overlap the light blocking area NPXA and each of the pixel areas PXA-R, PXA-G, and PXA-B. For example, the light blocking layer ST may have a black color to absorb source light or external light.

In detail, referring to FIG. 6C, the light blocking layer ST includes a first light blocking portion ST-NA overlapping the light blocking area NPXA and a second light blocking portion ST-PA overlapping the pixel areas PXA-R, PXA-G, and PXA-B.

The first blocking portion ST-NA may be disposed on the barrier part DM overlapping the light blocking area NPXA. The first blocking portion ST-NA may expose at least a portion of the bottom surface of an outer surface of the barrier part DM and entirely cover the remaining outer surface of the barrier part DM. Here, the outer surface of the barrier part DM may represent the bottom surface and the side surface. A bottom surface opening OPm may be defined in the first light blocking portion ST-NA, and the bottom surface of the barrier part DM may be exposed through the bottom surface opening OPm.

Particularly, the bottom surface opening OPm may be defined in the first light blocking portion ST-NA to overlap between two adjacent pixel areas of the pixel areas PXA-R, PXA-G, and PXA-B. Referring to FIG. 6C, for example, the pixel areas PXA-R, PXA-G, and PXA-B may be arranged in the first direction DR1 and have a shape in which the bottom surface opening OPm extends in the second direction DR2. For another example, when the pixel areas PXA-R, PXA-G, and PXA-B are arranged in the second direction DR2, the bottom surface opening OPm may have a shape extending in the first direction DR1.

The second light blocking portion ST-PA may overlap the pixel areas PXA-R, PXA-G, and PXA-B and be disposed on the upper insulation layer IL. Particularly, the second light blocking portion ST-PA may be directly disposed on the upper insulation layer IL, and an opening OPx may be defined in the second light blocking portion ST-PA in each of the pixel areas PXA-R, PXA-G, and PXA-B. The upper insulation layer IL may be exposed through the opening OPx, and the second light blocking portion ST-PA may have a shape, which surrounds the opening OPx, in the top plan view. An image may be seen from the outside by light emitted through the opening OPx.

The first light blocking portion ST-NA and the second light blocking portion ST-PA may be integrated with each other through the same process. For example, the first light blocking portion ST-NA and the second light blocking portion ST-PA may be connected to each other in the top plan view.

According to an embodiment of the present disclosure, in the top plan view, the second light blocking portion ST-PA overlapping one pixel area of the pixel areas PXA-R, PXA-G, and PXA-B may have a surface area greater than that of the opening OPx overlapping the one pixel area. Hereinafter, for example, although one pixel area is described as a first pixel area PXA-R, the one pixel area may correspond to the second pixel area PXA-G or the third pixel area PXA-B.

In detail, the second light blocking portion ST-PA overlapping the first pixel area PXA-R includes the opening OPx overlapping the first pixel area PXA-R. The second light blocking portion ST-PA overlapping the first pixel area PXA-R may include a first light blocking area P1a and a second light blocking area P1b, which are spaced apart from each other in the first direction DR1 with the opening OPx. According to the present disclosure, a width of the first light blocking area P1a, a width of the second light blocking region P1b, and a width of the first opening OPx in the first direction DR1 may have a ratio of 1:1:1. That is, the first light blocking area P1a, the second light blocking region P1b, and the first opening OPx in the first direction DR1 may substantially have equal width. In this disclosure, the term 'the width of the comparison object is equal' may include a certain error range in the process.

Also, the first light blocking portion ST-PA overlapping the first pixel area PXA-R may include a third light blocking area P2a and a fourth light blocking area P2b, which are spaced apart from each other in the second direction DR2 with the opening OPx. According to the inventive concept, a width of the third light blocking area P2a, a width of the fourth light blocking region P2b, and a width of the first opening OPx in the second direction DR2 may have a ratio of 1:1:1. That is, the third light blocking area P2a, the fourth light blocking region P2b, and the opening OPx in the second direction DR2 may substantially have equal width.

As described above, external light reflection in which external light incident from the outside is reflected from internal constituents of the display panel DP may be reduced.

In detail, as illustrated in FIG. 5, external light incident through the light blocking area NPXA of the second base substrate BS2 may be absorbed through the light blocking portion BP2 of the third color filter CF-B. The external light incident through the pixel areas PXA-R, PXA-G, and PXA-B of the second base substrate BS2 may be absorbed into the color filter layer CFY or be partially transmitted. For example, light having the same wavelength as the color filter may be transmitted, and light having a different wavelength may be absorbed.

According to an embodiment of the present disclosure, the second light blocking portion ST-PA may have a black color and absorb external light transmitted through the color filter layer CFY. The external light transmitted through the color filter layer CFY may be absorbed through the second light blocking portion ST-PA and be transmitted to the lower display substrate 100 through the opening OPx defined in the second light blocking portion ST-PA. As described above, since the second light blocking portion ST-PA has the surface area greater than that of the opening OPx, an amount of light absorbed into the second light blocking portion ST-PA may be greater than that of light transmitted to the lower display substrate 100 through the opening OPx.

Thus, an intensity of the external light transmitted to the lower display substrate 100 may be weakened, and an intensity of the external light reflected by the circuit element layer DP-CL provided in the lower display substrate 100 may be reduced overall.

The reflection layer RT may be disposed on the light blocking layer ST. According to the present disclosure, the reflection layer ST may at least partially overlap the light blocking area NPXA and each of the pixel areas PXA-R, PXA-G, and PXA-B. The reflection layer RT may be made of a material that reflects light. For example, the reflection layer RT may be made of a metal or an aluminum.

In detail, referring to FIG. 6D, the reflection layer RT includes a first reflection portion RT-NA disposed on the first light blocking portion ST-NA and a second reflection portion RT-PA disposed on the second light blocking portion ST-PA. The first light blocking portion ST-NA is disposed between the barrier part DM and the first reflection portion RT-NA, and the second light blocking portion ST-PA is disposed between the upper insulation layer IL and the second reflection portion RT-PA.

For example, the first reflection portion RT-NA may entirely cover the first light blocking portion ST-NA, and the second reflection portion RT-PA may entirely cover the second light blocking portion ST-PA. As a result, the light blocking layer ST may not be exposed by the reflection layer RT in a direction facing the lower display substrate 100.

According to an embodiment of the present disclosure, the opening OPx may have a shape that passes through the second light blocking portion ST-PA and the second reflection portion RT-PA. The upper insulation layer IL may be exposed through the opening OPx passing through the second light blocking portion ST-PA and the second reflection portion RT-PA.

Additionally, the bottom surface opening OPm may have a shape that passes through the first light blocking portion ST-NA and the first reflection portion NT-NA. That is, a bottom surface of the barrier part DM may be exposed through the bottom surface opening OPm passing through the first light blocking portion ST-NA and the first reflection portion NT-NA.

Referring back to FIG. 5, the reflection layer RT according to the present disclosure may entirely cover a side surface of the barrier part DM. As a result, as illustrated in FIG. 4B, the first color light emitted from the display element layer DP-OLED of the lower display substrate 100 may be recirculated through the reflection layer RT to increase the amount of light emitted to the outside through the opening OPx.

The light control layer CCL includes a first conversion part CCF-R, a second conversion part CCF-G, and a transmission part CCF-B. The light control layer CCL may be disposed on the upper insulation layer IL to overlap the pixel areas PXA-R, PXA-G, and PXA-B. According to the present disclosure, an upper portion of the upper insulation layer IL overlapping one pixel area of the pixel areas PXA-R, PXA-G, and PXA-B may be an empty space that is surrounded by the barrier part DM. The light control layer CCL may be disposed in the empty space above the upper insulation layer IL, which is defined by the barrier part DM. According to an embodiment, the light control layer CCL may be filled into the empty space above the upper insulation layer IL by using an inkjet printing device. A portion of the light control layer CCL disposed in the empty space may contact the upper insulation layer IL through the opening OPx, and a remaining portion may contact the reflection layer RT.

The first conversion part CCF-R may overlap the first pixel area PXA-R to convert the first color light, emitting the light having the second color different from the first color. The second conversion part CCF-G may overlap the second pixel area PXA-G to convert the first color light, emitting the light having the third color different from the second color. Here, the second color light may be a red color, and the third color light may have a green color. The transmission part CCF-B may overlap the third pixel area PXA-B to transmit the first color light.

In detail, referring to FIG. 6E, the first conversion part CCF-R may include a first light emitting material ER-R, and the second conversion part CCF-G may include a second light emitting material EP-G. The first light emitting material EP-R may absorb the first color light that is the blue light to emit the second color light that is the red light, and the second light emitting material EP-G may absorb the first color light to emit the third color light that is the green light. The transmission part CCF-B may be a portion that does not include the light emitting material. The transmission part CCF-B may be a portion that transmits the first color light.

Also, each of the first conversion part CCF-R, the second conversion part CCF-G, and the transmission part CCF-B may include a base resin BR. The base resin BR may be a polymer resin. For example, the base resin BR may include an acrylic-based resin, a urethane-based resin, a silicon-based resin, and an epoxy-based resin. The base resin BR may be a transparent resin.

Also, each of the first conversion part CCF-R, the second conversion part CCF-G, and the transmission part CCF-B may include scattering particles OL. The scattered particles OL may be TiO2 or silica-based nano particles. The scattering particles OL may scatter light emitted from the light emitting material to emit the light to the outside of the conversion part. Also, when the transmission part CCF-B transmits the light, the scattering particles OL may scatter the incoming light to emit the incoming light to the outside.

The first and second light emitting materials EP-R and EP-G (hereinafter, referred to as light emitting materials) contained in the first conversion part CCF-R and the second conversion part CCF-G respectively may be phosphors or quantum dots.

For example, the phosphor used as the light emitting materials EP-R and EP-G may be inorganic phosphors. The phosphors used as the light emitting materials EP-R and EP-G in the display panel DP according to an embodiment may be green phosphors or red phosphors.

The phosphors used in the light control layer CCL according to an embodiment are not limited to the disclosed materials, and thus, well-known phosphor materials in addition to the above-described phosphors may be used.

For another example, the light emitting materials EP-R and EP-G contained in the first conversion part CCF-R and the second conversion part CCF-G may be quantum dots. A core of the quantum dot may be selected from Group II-VI compounds, Group III-V compounds, Group IV-VI compounds, Group IV elements, Group IV compounds, and any combination of the above.

The Group II-VI compounds may be selected from binary element compounds selected from the group consisting of CdSe, CdTe, ZnS, ZnSe, ZnTe, ZnO, HgS, HgSe, HgTe, MgSe, MgS, and a combination thereof, ternary element compounds selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and quaternary element compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and any combination above.

The Group III-V compounds may be selected from binary element compounds selected from the group consisting of GaN, GaP, GaAs, GaSb, AN, AlP, AlAs, AlSb, InN, InP, InAs, InSb, and a combination thereof, ternary element compounds selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a combination thereof, and quaternary element compounds selected form the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any combination above.

The Group IV-VI compounds may be selected from binary element compounds selected from the group consisting of SnS, SnSe, SnTe, PbS, PbSe, PbTe, and a combination thereof, ternary element compounds selected from the group consisting of SnSeS, SnSeTe, SnSTe, PbSeS, PbSeTe, PbSTe, SnPbS, SnPbSe, SnPbTe, and a combination thereof, and quaternary element compounds selected form the group consisting of SnPbSSe, SnPbSeTe, SnPbSTe, and a combination thereof. The Group IV elements may be selected from the group consisting of Si, Ge, and a combination thereof. The Group IV compounds may be binary element compounds selected from the group consisting of SiC, SiGe, and any combination above.

Here, the binary element compounds, the ternary element compounds, and the quaternary element compounds may exist in the particle at a uniform concentration or exist in the particle in a state in which concentration distribution is partitioned into partially different states. Alternatively, the quantum dot may have a core-shell structure in which one quantum dot surrounds the other quantum dot. An interface between the core and the shell may have a concentration gradient in which an element existing in the shell has a concentration that gradually decreases toward a center.

In some embodiments, the quantum dot may have a core-shell structure, which includes a core including the above-described nano crystal and a shell surrounding the core. The shell of the quantum dot may serve as a protection layer that prevents the core from being chemically changed to maintain the semiconductor characteristics and/or may serve as a charging layer for imparting electrophoretic characteristics to the quantum dot. The shell may be a single layer or a multi-layer. An interface between the core and the shell may have a concentration gradient in which an element existing in the shell has a concentration that gradually decreases toward a center. For example, the shell of the quantum dot may include oxide of a metal or nonmetal, a semiconductor compound, or any combination above.

For example, the oxide of the metal or nonmetal may include binary element compounds of $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, $NiO$, and the like or ternary element compounds $MgAl_2O_4$, $CoFe_2O_4$, $NiFe_2O_4$, $CoMn_2O_4$, and the like, but the embodiment of the inventive concept is not limited.

Alternatively, the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but the embodiment of the inventive concept is not limited.

The quantum dot may have a full width of half maximum (FWHM) of an emission wavelength spectrum of about 45 nm or less, preferably about 40 nm or less, more preferably about 30 nm or less. In this range, color purity and color reproducibility may be improved. Also, light emitted through the quantum dot may be emitted in all directions to improve an optical viewing angle.

Also, the quantum dot has a shape that is generally used in the art and is not specifically limited in shape. However, the quantum dot may have a spherical shape, a pyramidal shape, a multi-arm shape, a cubic nanoparticle shape, a nanotube shape, a nanowire shape, a nanofiber shape, a nanoplate particle shape, or the like.

The quantum dot may adjust a color of emitted light according to a size. Thus, the quantum dot may emit light having various colors such as a blue color, a red color, and a green color.

Referring back to FIG. 5, the capping layer QCL may entirely cover the light control layer CCL and the barrier part DM. The capping layer QCL may include an organic layer and an inorganic layer. The capping layer QCL may entirely protect the light control layer CCL, the barrier part DM, and the reflection layer RT against the outside.

Additionally, an inner space may be defined between the capping layer QCL and the lower display substrate 100. The inner space may be filled with a filler (not shown).

Although not shown, the capping layer QCL disposed on the barrier part DM may be spaced a predetermined distance from the lower display substrate 100, but the embodiment of the present disclosure is not limited. For example, one of the capping layer QCL, the light blocking layer ST, and the reflection layer RT may be directly disposed on the lower display substrate 100.

Figure 7:
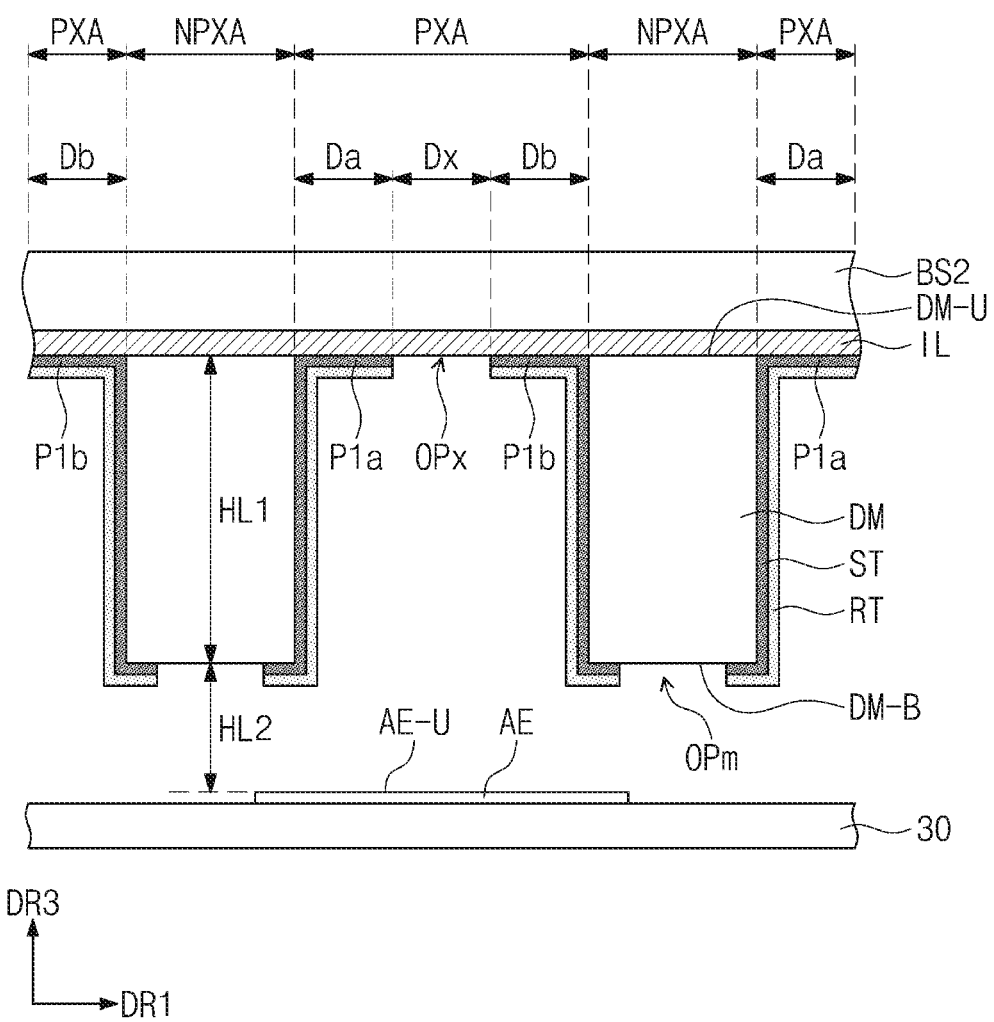
FIG. 7 is a cross-sectional view illustrating a portion of the upper display substrate according to an embodiment of the present disclosure.

FIG. 7 is a cross-sectional view illustrating a portion of the upper display substrate according to an embodiment of the present disclosure.

Referring to FIG. 7, the first light blocking area P1a and the second light blocking area P1b, which correspond to the second light blocking portion ST-PA described with reference to FIG. 6C are illustrated, and a third insulation layer 30 provided in the lower display substrate 100 and a first electrode AE provided in the light emitting element OLED described with reference to FIG. 4B are illustrated. A width of the first light blocking area P1a in the first direction DR1 is defined as a first length Da, and a width of the second light blocking area P1b in the first direction DR1 is defined as a second length Db. Also, a width of the opening OPx in the first direction DR1 is defined as a third length Dx.

According to an embodiment of the present disclosure, the first length Da, the second length Db, and the third length Dx may be substantially equal. However, the widths of the first light blocking area P1a, the second light blocking area P1b, and the opening OPx are not limited and thus may be variously changed according to embodiments. For example, the width of the opening OPx in the first direction DR1 may be greater than that of the first light blocking area P1a or the second light blocking area P1b.

Also, a height of the barrier part DM in the third direction DR3 is defined as a first length HL1. The height of the barrier part DM may represent the shortest distance between a top surface DM-U of the barrier part DM and a bottom surface DM-B of the barrier part DM. The shortest distance between the bottom surface DM-B of the barrier part DM and a top surface AE-U of the first electrode AE is defined as a second length HL2.

According to an embodiment of the present disclosure, the first length HL1 may be greater than the second length HL2. For example, a ratio of the first length HL1 to the second length HL2 may be set to 2:1.

However, the ratio of the first length HL1 and the second length HL2 is not limited. As described above, one of the capping layer QCL, the light blocking layer ST, and the reflection layer RT may be directly disposed on the lower display substrate 100. In this case, the second length HL2 may be set to zero.

As described above, the external light incident from the outside may be reduced through a ratio in surface area between the second light blocking portion ST-PA and the opening OPx, which overlap the same pixel area described with reference to FIG. 7. Furthermore, emission efficiency in which the first color light emitted from the display element layer DP-OLED is emitted to the outside may be improved by the ratio between the first length HL1 and the second length HL2, which are described with reference to FIG. 7.

FIGS. 8A, 8B, 8C, and 8D are views illustrating a method for manufacturing an upper display substrate according to an embodiment of the present disclosure.

Referring to FIG. 8, a process of providing a preliminary barrier part DM-P for forming a barrier part DM according to the preset disclosure is illustrated. In this disclosure, the preliminary barrier part DM-P may represent a temporary layer in a process before being patterned to form the barrier part DM. The preliminary barrier part DM-P may be entirely formed on an upper insulation layer IL. Particularly, the preliminary barrier part DM-P may be directly formed on the upper insulation layer IL.

Figure 8A:
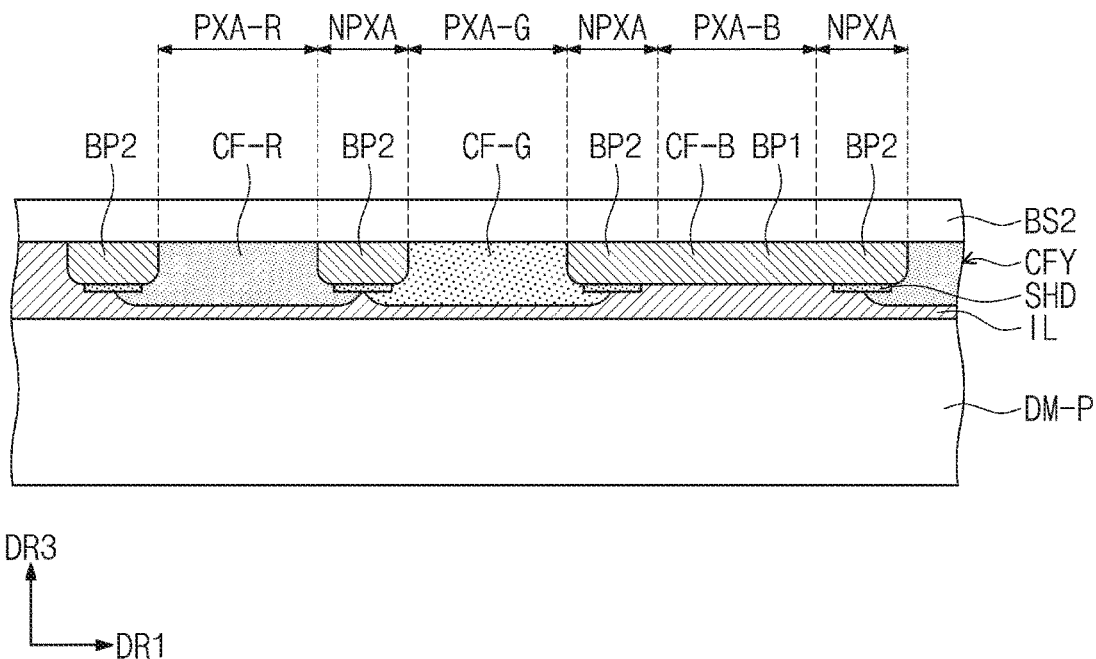
FIGS. 8A, 8B, 8C, and 8D are views illustrating a method for manufacturing an upper display substrate according to an embodiment of the present disclosure.
Figure 8B:
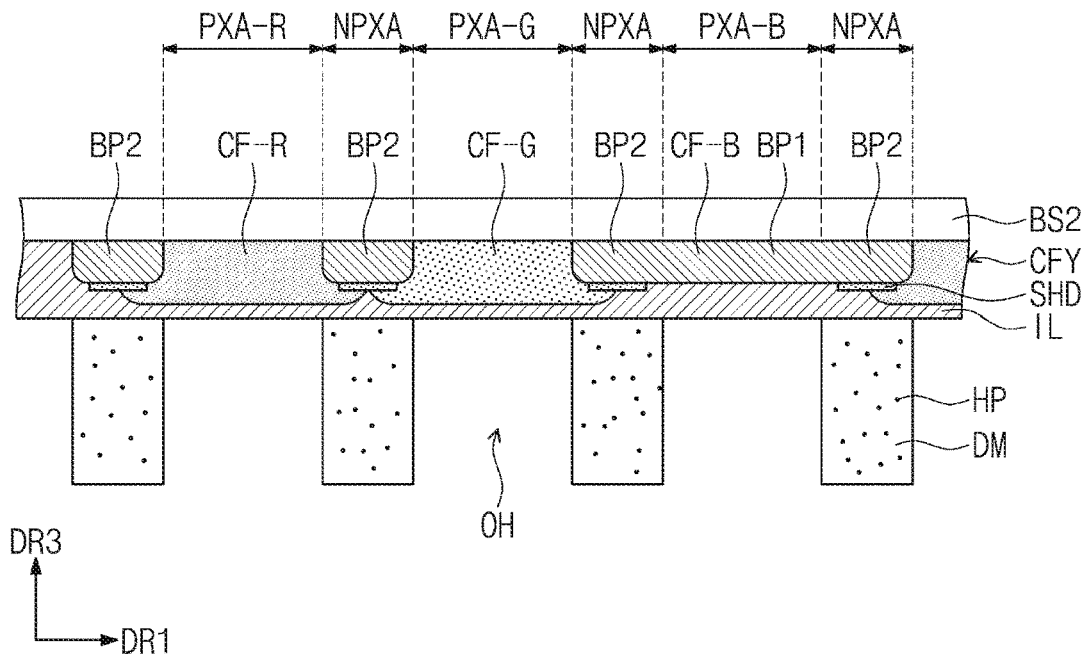

Referring to FIG. 8B, after the preliminary barrier part DM-P is provided on the upper insulation layer IL, the preliminary barrier layer DM-P may be patterned to form the barrier layer DM having a barrier opening OH. For example, after an organic layer is formed on the upper insulation layer IL, the organic layer may be exposed and developed to form the barrier part DM having the barrier opening HO.

According to an embodiment of the present disclosure, the barrier part DM may include a hydrophilic group (hereinafter, referred to HP). However, the embodiment of the present disclosure is not limited. For example, the barrier part DM may be made of a material having a hydrophobic group (hereinafter, referred to HD) or amphiphiles including all of the HP and the HD.

Figure 8C:
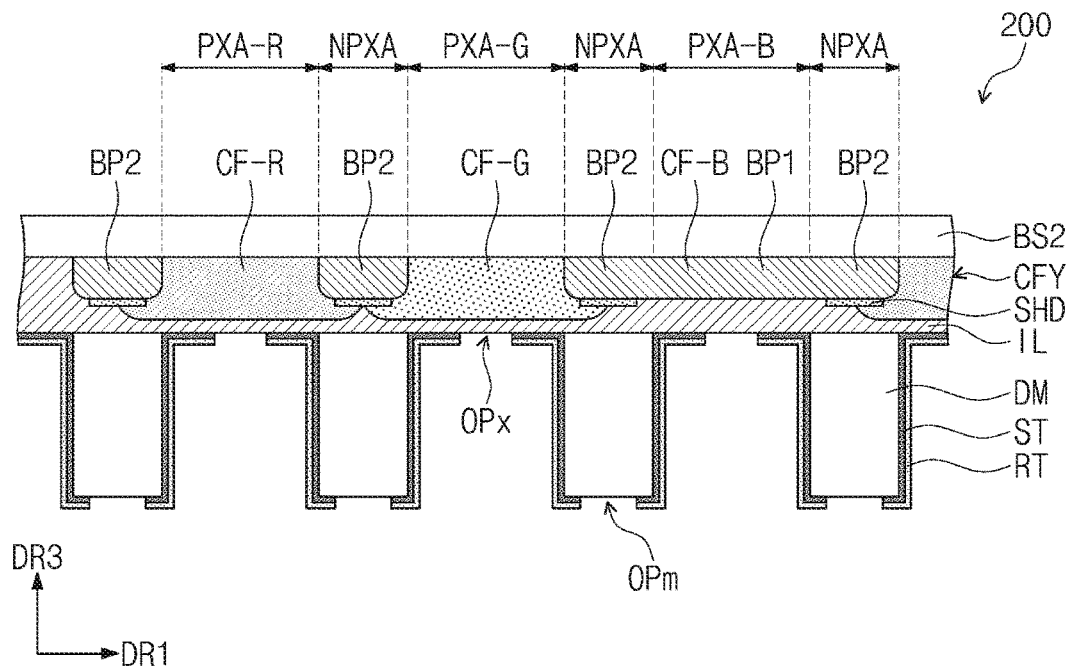

Referring to FIG. 8C, a light blocking layer ST may cover the barrier part DM and be entirely formed on the upper insulation layer IL. Then, a reflection layer RT may be entirely formed on the light blocking layer ST. That is, each of the light blocking layer ST and the reflection layer RT may entirely overlap pixel areas PXA-R, PXA-G, and PXA-B and a light blocking area NPXA.

According to an embodiment, a plurality of openings OPx overlapping each of the pixel areas PXA-R, PXA-G, and PXA-B and passing through the light blocking layer ST and the reflection layer ST are formed. In this case, the opening OPx defined in one pixel area may have a surface area less than that of the light blocking layer ST overlapping the same pixel area.

According to an embodiment, a bottom surface opening OPm overlapping the light blocking area NPXA and passing through the light blocking layer ST and the reflection layer RT is formed. The bottom surface opening OPm exposes a bottom surface of the barrier part DM.

Figure 8D:
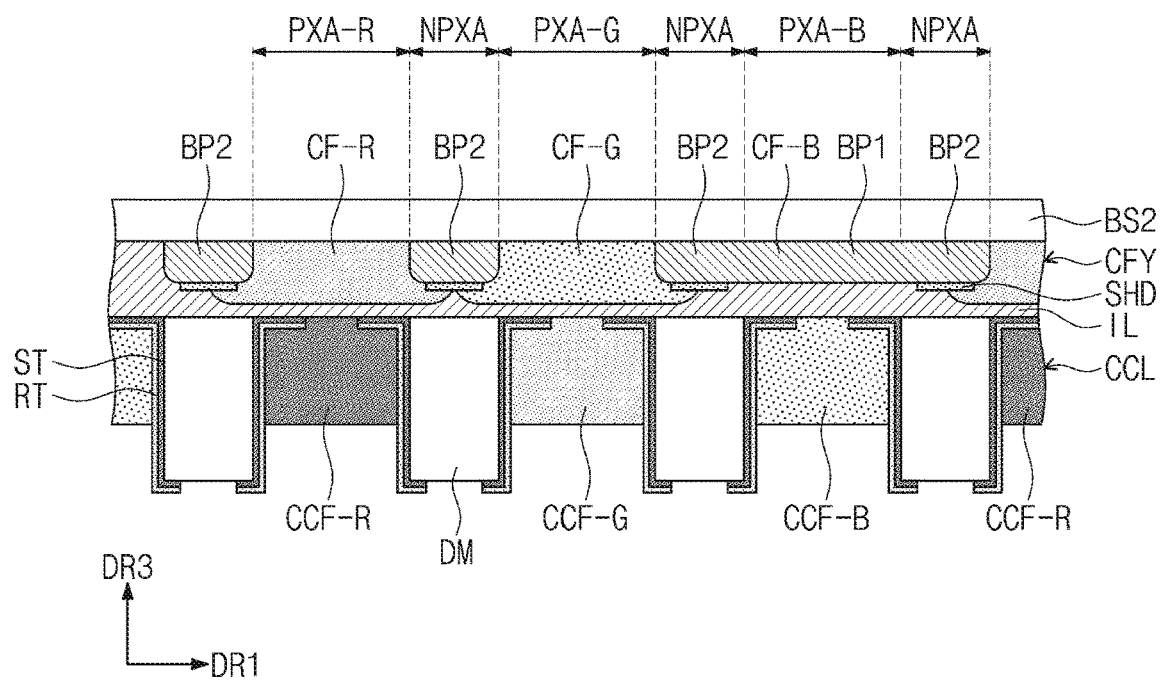

Referring to FIG. 8D, a light control layer CCL including a first conversion part CCF-R overlapping a first pixel area RXA-R, a second conversion part CCF-G overlapping a second pixel area PXA-G, and a transmission part CCF-B overlapping the third pixel area RXA-B are formed on the reflection layer RT.

For example, when the barrier part DM is made of a material including the HP, the light control layer CCL may be made of a material including the HD. For another example, when the barrier part DM is made of a material including the HD, the light control layer CCL may be made of a material including the HP.

Thereafter, an upper display substrate 200 and a lower display substrate 100 are coupled to each other through an adhesion layer SLM of FIG. 2. That is, a first base substrate BS1 (see FIG. 4B) and a second base substrate BS2 may be coupled to each other through the adhesion layer SLM.

FIGS. 9A to 9D are views illustrating a method for manufacturing an upper display substrate according to another embodiment of the present disclosure.

Figure 9A:
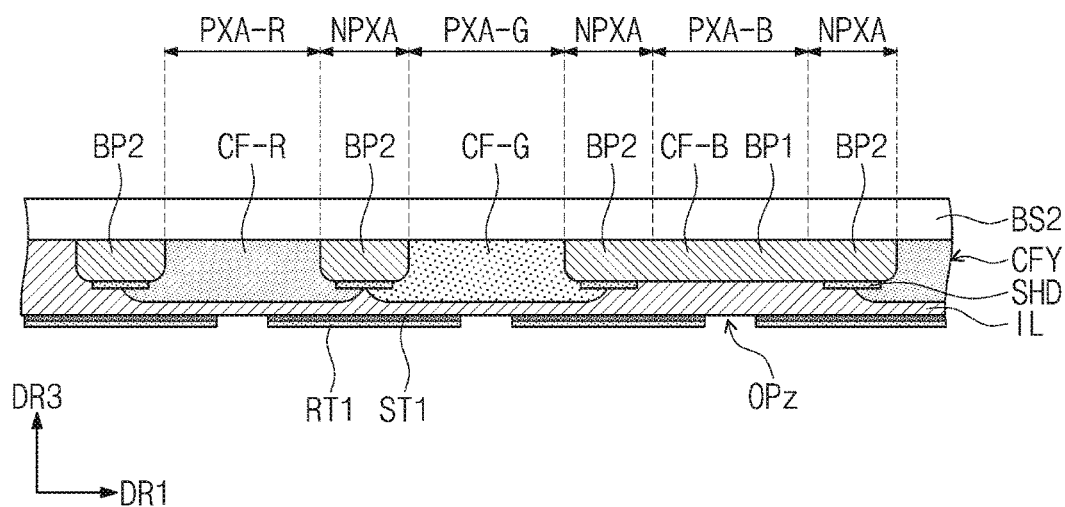
FIGS. 9A, 9B, 9C, and 9D are views illustrating a method for manufacturing an upper display substrate according to another embodiment of the present disclosure.

Referring to FIG. 9A, a first light blocking layer ST1 is entirely formed on an upper insulation layer IL. The first light blocking layer ST1 may be directly formed on the upper insulation layer IL. A first reflection layer RT1 is formed on the first light blocking layer ST1. The first light blocking layer ST1 is disposed between the upper insulation layer IL and the first reflection layer RT1.

According to the present disclosure, a plurality of openings OPz passing through the first light blocking layer ST1 and the first reflection layer RT1 are defined in the first light blocking layer ST1 and the first reflection layer RT1. The openings OPz overlap each of the pixel areas PXA-R, PXA-G, and PXA-B.

For example, the opening OPz overlapping one pixel area may have substantially the same surface area as the opening OPx of FIG. 6C in a top plan view. Also, the first light blocking layer ST1 overlapping the pixel area of FIG. 9A may have substantially the same surface area as a second light blocking portion ST-PA of FIG. 6C in the plan view.

Although each of the first light blocking layer ST1 and the second reflection layer RT1 overlaps the light blocking area NPXA in FIG. 9A, the embodiment of the present disclosure is not limited. For example, each of the first light blocking layer ST1 and the second light blocking layer RT1 may not overlap the light blocking area NPXA.

Figure 9B:
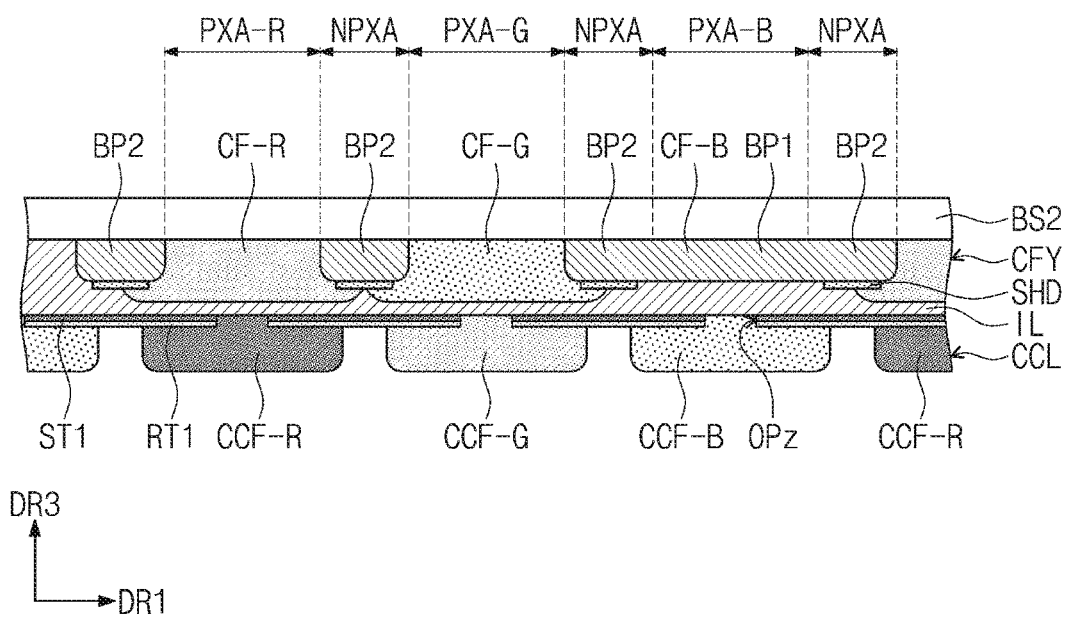

Referring to FIG. 9B, a first conversion part CCF-R, a second conversion part CCF-G, and a transmission part CCF-B are formed on an upper insulation layer IL to overlap the pixel areas PXA-R, PXA-G, and PXA-B respectively. The first conversion part CCF-R may overlap the first pixel area PXA-R and be disposed on the first reflection layer RT1 to contact the upper insulation layer IL through an opening OPz. The second conversion part CCF-G may overlap the second pixel area PXA-G and be disposed on the first reflection layer RT1 to contact the upper insulation layer IL through an opening OPz. The transmission part CCF-B may overlap the third pixel area PXA-B and be disposed on the first reflection layer RT1 to contact the upper insulation layer IL through an opening OPz.

Figure 9C:
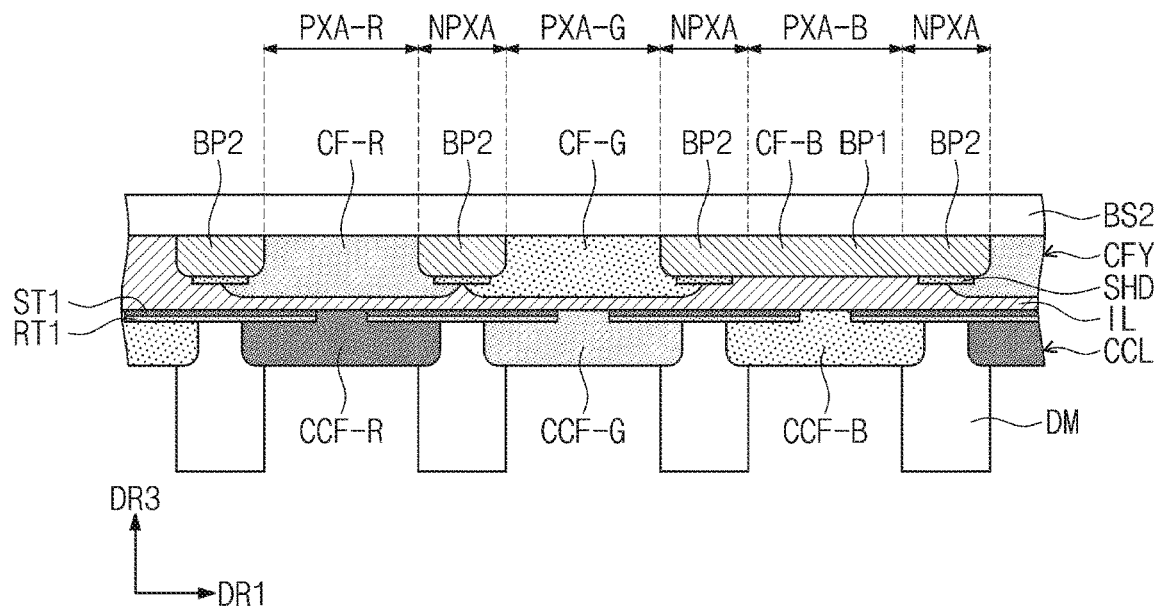

Referring to FIG. 9C, a barrier part DM may be formed on a light control layer CCL to overlap a light blocking area NPXA. The barrier part DM may be formed by exposing and developing an organic layer as described above. The barrier part DM of FIG. 9C may be disposed on a top surface part and a first reflection layer RT1 of a light control layer CCL facing a lower display substrate 100, but may not be directly disposed on the upper insulation layer IL. However, the embodiment of the present disclosure is not limited. For example, when the first reflection layer RT1 and the first light blocking layer ST1 do not overlap the light blocking area NPXA, at least a portion of the barrier part DM may be directly formed on the upper insulation layer IL.

Figure 9D:
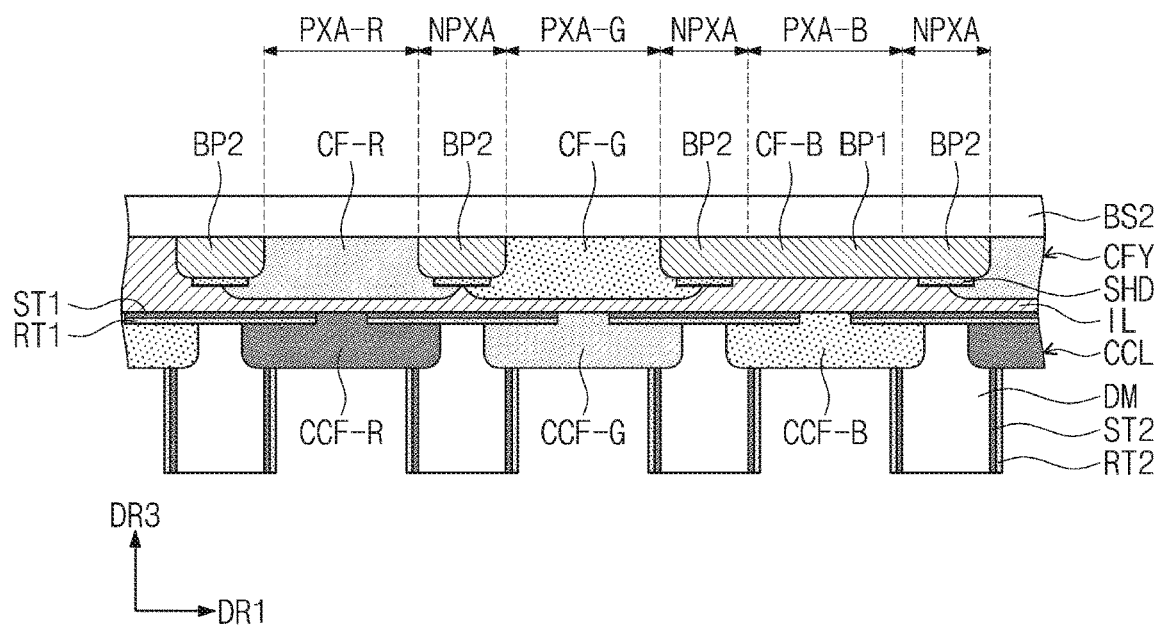

Referring to FIG. 9D, a second light blocking layer ST2 is entirely disposed on a side surface of the barrier layer DM. Also, a second reflection layer RT2 is entirely disposed on the second light blocking layer ST2. According to the present disclosure, the first light blocking layer ST1 and the second light blocking layer ST2 may be spaced apart from each other in the third direction DR3, and the first reflection layer RT1 and the second reflection layer RT2 may be spaced apart from each other in the third direction DR3.

That is, the light control layer CCL may be disposed between the first light blocking layer ST1 and the second light blocking layer ST2. Also, the light control layer CCL may be disposed between the first reflection layer RT1 and the second reflection layer RT2.

According to the embodiment of the present disclosure, the upper display substrate may include the light blocking layer that at least partially overlaps the pixel area. The external light incident through the pixel area may be blocked by the light blocking layer to reduce the amount of light to be transmitted to the inside of the display panel through the pixel area. As a result, the overall external light reflection of the display panel may be reduced.

In addition, the upper display substrate may include the reflection layer disposed on the light blocking layer. The first color light emitted from the display element layer of the lower display substrate may be recirculated through the reflection layer to improve the efficiency of the light emitted to the outside through the opening defined in the light blocking layer.

As described above, the embodiment is disclosed in the drawings and the specification. While specific terms were used, they were not used to limit the meaning or the scope of the present disclosure described in claims, but merely used to explain the present disclosure. Accordingly, a person having ordinary skill in the art will understand from the above that various modifications and other equivalent embodiments are also possible. Hence, the real protective scope of the present disclosure shall be determined by the technical scope of the accompanying claims.

What is claimed is:

1. A display panel comprising:
    an upper display substrate on which a plurality of pixel areas and a light blocking area adjacent to the pixel areas are defined; and
    a lower display substrate facing the upper display substrate and comprising a plurality of display elements respectively overlapping the pixel areas,
    wherein the upper display substrate comprises:
    a base substrate defining the pixel areas and the light blocking area;
    a barrier part overlapping the light blocking area and disposed on the base substrate;
    a light blocking layer comprising a first light blocking portion disposed on the barrier part and a second light blocking portion disposed on a same layer as the barrier part is disposed on to respectively overlap the pixel areas;
    a reflection layer comprising a first reflection portion disposed on the first light blocking portion and a second reflection portion disposed on the second light blocking portion; and
    a light control layer overlapping the pixel areas and disposed on the reflection layer,
    wherein a plurality of openings passing through the second light blocking portion and the second reflection portion are defined in each of the pixel areas, and
    the openings overlap the pixel areas, respectively.

2. The display panel of claim 1, wherein each of the openings is surrounded by the second light blocking portion in a top plan view.

3. The display panel of claim 2, wherein the second light blocking portion overlapping a first pixel area of the pixel areas comprises a first light blocking area and a second light blocking area, which are spaced apart from each other in a first direction with respect to a first opening, which overlaps the first pixel area, of the openings, and
    a width of the first light blocking area, a width of the first opening, and a width of the second light blocking area in the first direction are substantially equal.

4. The display panel of claim 3, wherein the second light blocking portion further comprises a third light blocking area and a fourth light blocking area, which are spaced apart from each other in a second direction perpendicular to the first direction with respect to the first opening, and
    a width of the third light blocking area, the width of the first opening, and a width of the fourth light blocking area in the second direction are substantially equal.

5. The display panel of claim 2, wherein the second light blocking portion overlapping a first pixel area of the pixel areas has a surface area greater than a surface area of the opening, which overlaps the first pixel area, in the top plan view.

6. The display panel of claim 1, wherein the first light blocking portion is disposed between the barrier part and the first reflection portion, and
    the second light blocking portion is disposed between the base substrate and the second reflection portion.

7. The display panel of claim 6, wherein the barrier part comprises a top surface facing the base substrate, a bottom surface facing the lower display substrate, and a side surface connecting the top surface to the bottom surface, and
    the first light blocking portion exposes at least a portion of the bottom surface of the barrier part.

8. The display panel of claim 7, wherein a bottom surface opening passing through the first light blocking portion and the first reflection portion and exposing the bottom surface of the barrier part is defined.

9. The display panel of claim 6, wherein the reflection layer entirely overlaps the light blocking layer.

10. The display panel of claim 1, further comprising:
    a color filter layer disposed between the base substrate and the light control layer; and
    an upper insulation layer covering the color filter layer and disposed on the base substrate,
    wherein each of the openings exposes the upper insulation layer.

11. The display panel of claim 10, wherein the display elements emit first color light to the upper display substrate,
    the pixel areas comprise first, second, and third pixel areas that are arranged in one direction, and
    the light control layer comprises:
    a first conversion part overlapping the first pixel area and configured to convert the first color light so as to emit second color light;
    a second conversion part overlapping the second pixel area and configured to convert the first color light so as to emit third color light different from the second color light; and
    a transmission part overlapping the third pixel area and configured to transmit the first color light.

12. The display panel of claim 11, wherein the color filter layer comprises:
    a first color filter overlapping the first pixel area and configured to transmit the second color light different from the first color light;
    a second color filter overlapping the second pixel area and configured to transmit the third color light different from the second color light; and
    a third color filter overlapping the third pixel area and configured to transmit the first color light,
    wherein the third color filter comprises a filter portion overlapping the third pixel area and a light blocking portion overlapping the light blocking area.

13. The display panel of claim 1, wherein the lower display substrate further comprises a pixel defining layer in which light emitting openings respectively overlapping the pixel areas are defined,
- each of the display elements comprises a first electrode, a light emitting layer disposed on the first electrode, and a second electrode disposed on the light emitting layer, the first electrode is exposed by a corresponding light emitting opening of the light emitting openings, and
- a height of the barrier part is greater than the shortest distance from a bottom surface of the barrier part to a top surface of the first electrode in a thickness direction perpendicular to the base substrate.

14. The display panel of claim 13, wherein a ratio of the height of the barrier part to the shortest distance is 2:1 in the thickness direction.

15. The display panel of claim 1, wherein the first light blocking portion and the second light blocking portion are provided in an integrated shape, and
- the first reflection portion and the second reflection portion are provided in an integrated shape.

* * * * *